United States Patent [19]

Sparks et al.

[11] Patent Number: 4,733,234
[45] Date of Patent: Mar. 22, 1988

[54] REMOTE CALIBRATED POWER SOURCE SYSTEM AND METHOD

[75] Inventors: Stephen T. Sparks; John R. Regazzi, both of Santa Rosa, Calif.

[73] Assignee: Hewlett-Packard Company, Palo Alto, Calif.

[21] Appl. No.: 852,599

[22] Filed: Apr. 16, 1986

[51] Int. Cl.$^4$ .............................................. G08C 15/06
[52] U.S. Cl. ............................... 340/870.04; 364/571; 324/77 B
[58] Field of Search ............ 340/870.04, 870.39, 340/870.42, 870.43, 316; 364/571; 324/77 B, 77 R

[56] References Cited

U.S. PATENT DOCUMENTS

| | | | |
|---|---|---|---|
| 2,753,547 | 7/1956 | Donath et al. | 340/870.04 |
| 4,099,240 | 7/1978 | Rode et al. | 340/870.04 |
| 4,225,851 | 9/1980 | Reschovsky et al. | 340/870.04 |
| 4,451,826 | 5/1984 | Fasching | 340/870.04 |

FOREIGN PATENT DOCUMENTS 0968838  10/1982  U.S.S.R. .......................... 340/870.04

OTHER PUBLICATIONS

"Remotely Powered Measurement Systems" by E. R. Barr, IBM Tech. Discl. Bulletin, vol. 13, No. 8, Jan. 1971.

Primary Examiner—John W. Caldwell, Sr.
Assistant Examiner—Tyrone Queen
Attorney, Agent, or Firm—Patrick J. Barrett; William C. Milks, III

[57] ABSTRACT

A remote calibrated power source system comprises an instrument for generating power, the instrument being positioned at a first location, and a remote calibrated power source module for outputting calibrated power, the remote module being positioned at a second location that is removed from the first location. The remote module includes power sampling means for sampling the power generated by the instrument and generating a sampled voltage, the power sampling means having inherent frequency errors, a compensation circuit for generating a frequency-varying correction voltage, and summing amplifier means for receiving both the correction voltage and the sampled voltage and generating a compensated sampled voltage. The instrument includes oscillator means for generating the power, reference voltage means for generating a reference voltage, comparison means for receiving both the reference voltage and the compensated sampled voltage of the remote module and generating a modulating signal, and modulator means for receiving the modulating signal and modulating the power generated by the oscillator means, whereby the instrument and the remote module cooperatively generate the calibrated power.

8 Claims, 5 Drawing Figures

REMOTE CALIBRATED POWER SOURCE SYSTEM AND METHOD

TECHNICAL FIELD

This invention relates to instruments for generating electromagnetic energy, and more particularly, to a remote calibrated power source system.

BACKGROUND ART

Generally, an oscillator and multiplier combination is used to generate electromagnetic energy in the desired frequency range. To control the rate of the energy exiting such a combination, the system or instrument illustrated in FIG. 1 is used, designated 12. Instrument 12 comprises an oscillator 14, a modulator 16, an amplifier 18, a multiplier 20, a directional coupler 22, an operational amplifier 24 and reference voltage means 26. Directional coupler 22 includes a diode detector 28.

In use, oscillator 14 delivers power to modulator 16 in the 2.0 to 6.7 GHz frequency range. This power is increased by amplifier 18 and forwarded to multiplier 20. Multiplier 20 increases the frequency of the power input by whole number multiples, usually either two or three. This allows instrument 12 to deliver power in the frequency range of 2.0 to 200 GHz.

For controlling the amplitude of the instrument output, a negative feedback network is employed. In instrument 12, this negative feedback network encompasses directional coupler 22, second amplifier 24, reference voltage means 26 and modulator 16. In use, directional coupler 22 samples the power outputted by multiplier 20 before it exits instrument 12. The sampled power is usually a small fraction of the total power exiting instrument 12. The sampled power is detected by diode detector 28 which in turn generates a DC voltage that is proportional to the output of instrument 12.

To control the amplitude of the energy, second amplifier 24 is used. Second amplifier 24, an operational amplifier in the preferred embodiment, compares the DC voltage of diode detector 28 with a reference voltage from reference voltage means 26. The amplitude of the reference voltage has been preselected by a user. The difference between the two input voltages of op amp 24 causes op amp 24 to output a difference voltage. This difference voltage is fed back to modulator 16 which in turn alters the power delivered to amplifier 18 by oscillator 14 such that the total power exiting instrument 12 is affected. This negative feedback network is generally referred to as automatic leveling control (ALC) since it is capable of holding the instrument output at a desired amplitude independent of the frequency of that output.

In actuality, the ALC network holds the output of diode detector 28 constant with respect to frequency, and, in turn, holds the instrument output power constant since the output of diode detector 28 represents the instrument output power. In other words, for a true constant instrument output power versus frequency, the output of diode detector 28 may not be constant. The ALC system that is holding the output of diode detector 28 constant has the effect of impressing frequency dependent errors onto the amplitude of the power exiting instrument 12. These errors result from imperfections in both directional coupler 22 and diode detector 28. These errors are present in all real devices. These errors can be removed by summing a correction voltage with the reference voltage, as best shown in the system of FIG. 2, designated 12'.

System 12' in FIG. 2 includes a summing amplifier 30 that is connected between operational amplifier 24 and reference voltage means 26. Summing amplifier 30 is also connected to a compensation or correction voltage circuit 32. Since the correction voltage generated by circuit 32 must vary with frequency, it is derived from an input of circuit 32 that is a voltage proportional to frequency, e.g., 0.5 V/GHz. Thus, the power exiting instrument 12' is amplitude modulated versus frequency in such a way that the inherent errors associated with directional coupler 22 and diode detector 28 are compensated.

In addition to the frequency compensation aspect mentioned above, a logarithmic amplifier 34 is normally positioned between the output of diode detector 28 and one of the inputs of op amp 24. The presence of log amplifier 34 permits the user to control the amplitude of the instrument output in terms of decibels (dBm), a unit of measurement commonly used in this field. The characteristics of log amplifier 34 and compensation circuit 32 are generally tailored to match the specific directional coupler and diode detector which are used in system 12'.

The power exiting instrument 12 may be used in a variety of applications. The selected application generally dictates the choice of the output medium, i.e., either a coaxial cable or a waveguide. For example, coaxial cables are generally used in applications which require power in the 2.0 to 26.5 GHz frequency range. In this frequency range, the power travelling through the coaxial cable is not adversely affected. This attribute is due to the fact that a coaxial cable has low loss characteristics in this frequency range.

In the frequency range above 26.5 GHz, however, the power will deteriorate markedly if a coaxial cable is used. The amplitude of the power becomes unpredictable and inaccurate. Thus, waveguides must generally be used because they do not adversely affect the power in this frequency range. Waveguides, however, are generally cumbersome and difficult to use. For example, aligning and mounting a waveguide to the instrument output is a cumbersome and difficult procedure. The alignment and positioning of the waveguide with respect to the instrument output generally require additional tools, working stands, etc. After the waveguide has been mounted to the instrument, other devices must then be mounted to the distal end of the waveguide. The connection or mounting of the other devices to the waveguide is a similar cumbersome and difficult procedure. Once the waveguide and other devices have been properly mounted, the entire assembly, the instrument along with the attachments, is both cumbersome and difficult to maneuver.

DISCLOSURE OF THE INVENTION

It is a major object of the present invention to provide a remote calibrated power source system and method that is capable of providing a calibrated power output that is remote from an instrument that is generating the power.

It is another object of the present invention to provide a remote calibrated power source system the remote module for which contains calibration data.

It is a further object of the present invention to provide a remote calibrated power source system that is both easy to use and maneuverable.

In order to accomplish the above and still further objects, the present invention provides a remote calibrated power source system. The system comprises an instrument for generating power, the instrument being positioned at a first location, and a remote calibrated power source module for outputting a calibrated power, the remote module being positioned at a second location that is removed from the first location. The remote module includes power sampling means for sampling the power generated by the instrument and generating a sampled voltage, the power sampling means having inherent frequency errors, a compensation circuit for generating a frequency-varying correction voltage, and summing amplifier means for receiving both the correction voltage and the sampled voltage and generating a compensated sampled voltage. The instrument includes oscillator means for generating the power, reference voltage means for generating a reference voltage, comparison means for receiving both the reference voltage and the compensated sampled voltage of the remote module and generating a modulating signal, and modulator means for receiving the modulating signal and modulating the power generated by the oscillator means, whereby the instrument and the remote module cooperatively generate the calibrated power.

In the preferred embodiment, the remote module further comprises memory means for storing data pertinent to the operation of the system. In addition, the instrument includes a compensation circuit for receiving the data of the remote module memory means and generating an instrument frequency-varying correction voltage, and reference voltage means for receiving the data of the remote module memory means and generating a logarithmically adjusted reference voltage. Further, the instrument includes instrument summing amplifier means which sum both the instrument correction voltage and the logarithmically adjusted reference voltage and outputs a compensated reference voltage for the comparison means. The modulating signal outputted by the comparison means, after summing the compensated reference voltage and the compensated sampled voltage, now further refines the calibrated output of the remote module.

In use, the instrument of the preferred embodiment provides both a 0.5 V/GHz signal and a power signal, i.e., the power generated by the instrument. The remote module receives both of these signals and returns a compensated sampled voltage to the instrument. This compensated sampled voltage allows the instrument, in combination with the remote module, to output the calibrated power. This also permits the instrument to display, via conventional display devices, the actual, calibrated power at the remote module output. Moreover, the remote module memory means is storing data such as the start and stop frequencies, sweep speed, upper and lower limits of the amplitude of the remote module output, etc.

Other objects, features and advantages of the present invention will become apparent from the following detailed description of the best mode of the preferred embodiment, taken together with the accompanying drawings.

BEST MODE FOR CARRYING OUT THE INVENTION

Figure 3:
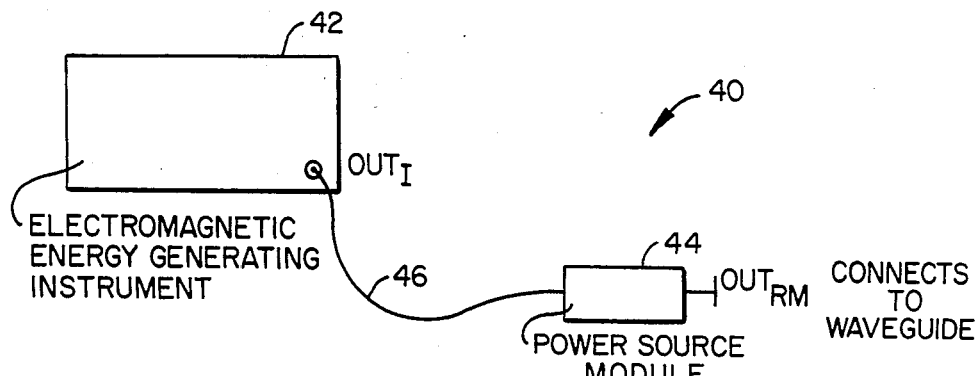
FIG. 3 is a simplified diagrammatical view of a remote calibrated power source system of the present invention.

Referring to FIG. 3, there is shown a remote calibrated power source system of the present invention, designated 40. System 40 comprises an instrument 42 for generating electromagnetic energy and a remote calibrated power source module 44. Instrument 42 and remote module 44 are connected together by a coaxial cable 46. Remote module 44 includes an output, designated $OUT_{rm}$. The output of remote module 44 is a calibrated power output. Connected to $OUT_{rm}$ is a conventional waveguide, not shown. In the preferred embodiment, the power exiting $OUT_{rm}$ is in the frequency range of 2.0 to 60.0 GHz. Instrument 42 in the preferred embodiment encompasses many of the functions and components of a Model 8350 Sweep Oscillator manufactured by Hewlett-Packard Company of Palo Alto, Calif.

Figure 4:
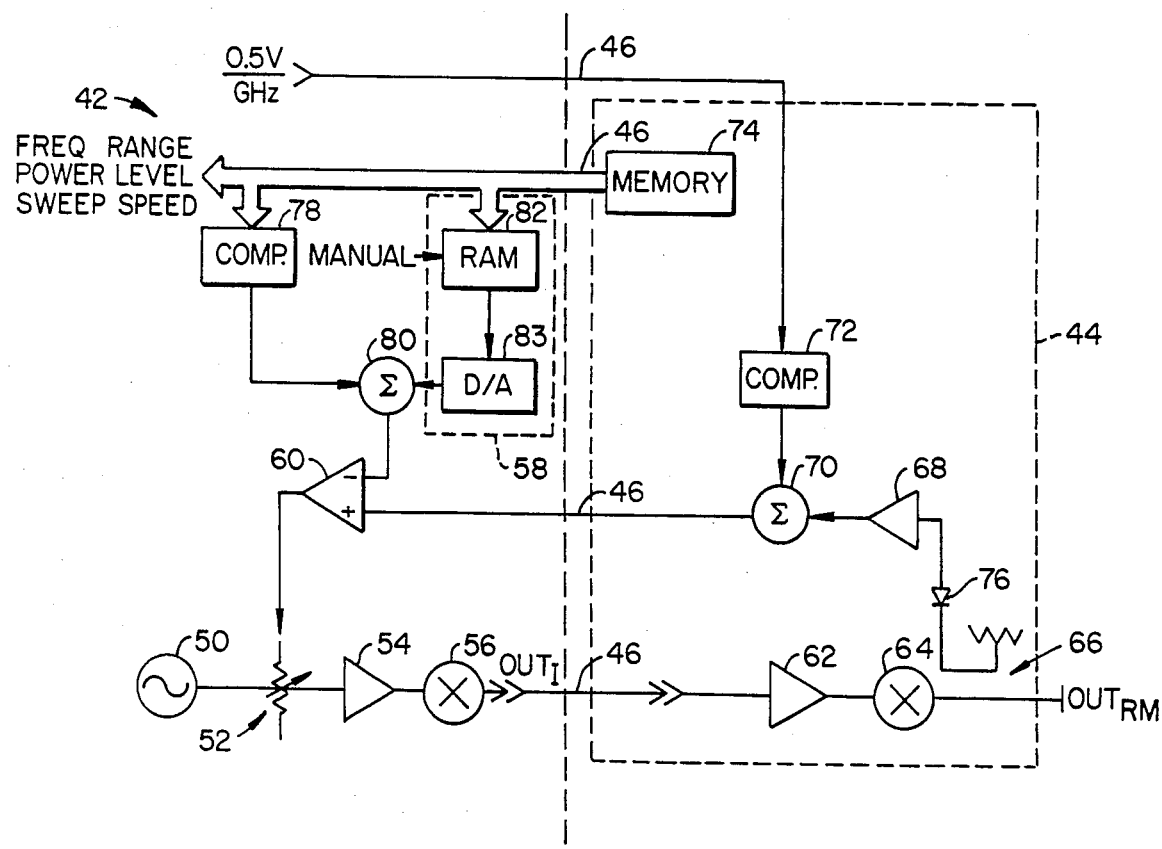
FIG. 4 is a simplified block diagram of the remote calibrated power source system of FIG. 3.

More particularly, as best shown in FIG. 4, instrument 42 includes an oscillator 50, a modulator 52, a first amplifier 54, a first multiplier 56, reference voltage means 58, and a second amplifier 60. Remote module 44 includes a third amplifier 62, a second multiplier 64, power sampling means 66, a logarithmic amplifier 68, a summing amplifier 70, a compensation circuit 72, and memory means 74. Moreover, power sampling means 66 in the preferred embodiment is a directional coupler that includes a diode detector 76.

Figure 1:
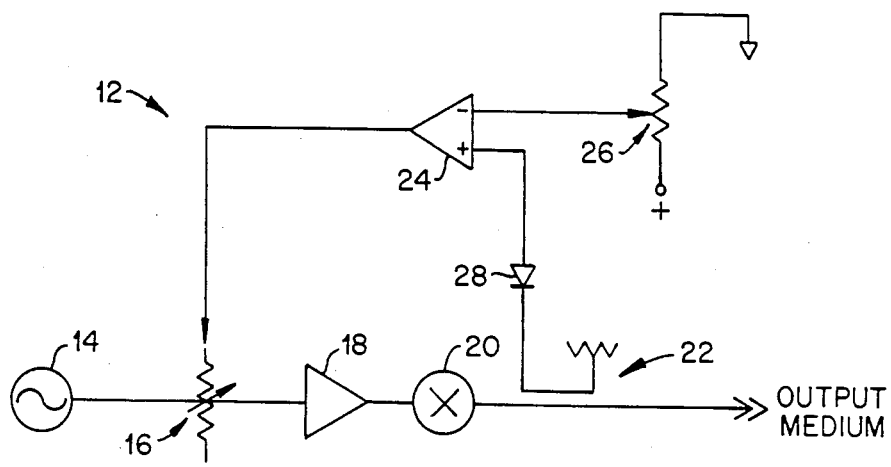
FIG. 1 is a simplified block diagram of a prior art instrument for generating electromagnetic energy.
Figure 2:
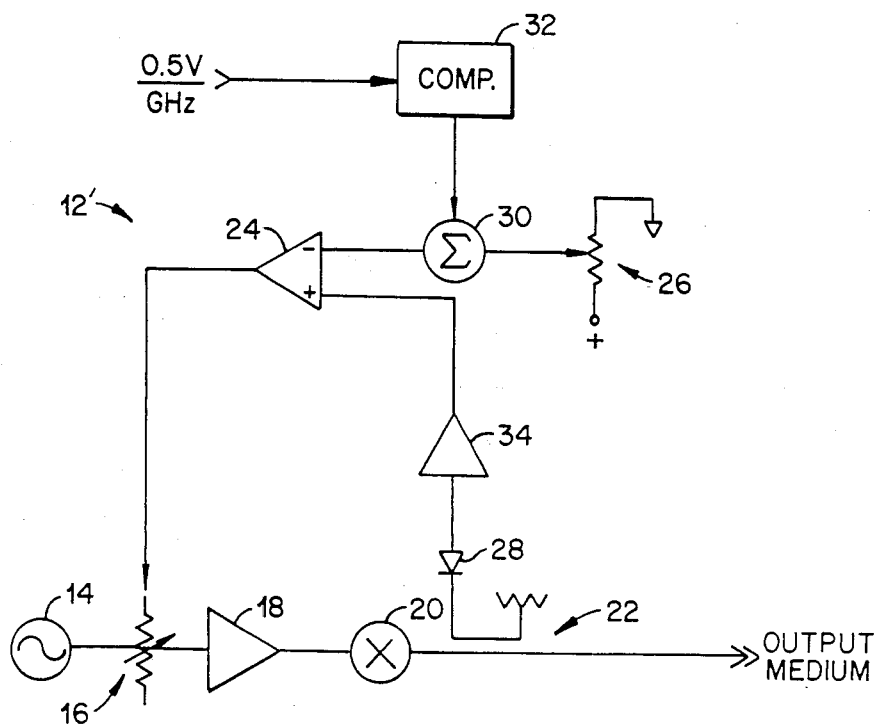
FIG. 2 is another simplified block diagram of a prior art instrument for generating electromagnetic energy.

Since many of the elements of system 40 are similar, if not identical, to the elements in the prior art instruments of FIGS. 1 and 2, many of the elements of system 40 will not be fully described unless it is appropriate. In use, oscillator 50 first delivers power in the frequency range of 2.0 to 6.7 GHz to modulator 52. This power is then increased by first amplifier 54 and forwarded to first multiplier 56. In turn, first multiplier 56 increases the frequency of the power by whole number multiples, e.g., either two or three. Thus, the power exiting instrument 42 at the instrument output, $OUT_i$, is now in the frequency range of 2.0 to 20.0 GHz. Instrument 42, in particular oscillator 50 and first multiplier 56, may be programmed to output power in this frequency range.

Traveling through coaxial cable 46, the power outputted by instrument 42 enters remote module 44 and is amplified by third amplifier 62. The output of third amplifier 62 is then multiplied by second multiplier 64. Second multiplier 64 is capable of increasing the frequency of the power by a whole number multiple, e.g., either two or three. The whole number multiple is a fixed value. The remote module output, the power exiting at $OUT_{rm}$, is now in the frequency range of 2.0 to 60.0 GHz.

A small fraction of the remote module output is sampled by directional coupler 66. Diode detector 76 of directional coupler 66 is capable of providing a DC voltage that is proportional to the power of the remote module output. This DC voltage is forwarded to log amplifier 68, which in turn provides a voltage in dB$_m$ units. The output of log amplifier 68 is forwarded to summing amplifier 70. The other input of summing amplifier 70 is a frequency-varying correction voltage generated by compensation circuit 72. The input of compensation circuit 72 is a voltage that is proportional to frequency, e.g., 0.5 V/GHz. The input signal for compensation circuit 72 is a signal forwarded from instrument 42 via a conventional transmission line that is encased with coaxial cable 46, not shown. The output of summing amplifier 70, a compensated sampled voltage, is forwarded to second amplifier 60 of instrument 42 via another conventional transmission line that is encased with coaxial cable 46, also not shown.

The other input of second amplifier 60, an operational amplifier in the preferred embodiment, is a reference voltage generated by reference voltage means 58. The modulating difference voltage generated by op amp 60 is forwarded to modulator 52 which in turn affects the power outputted by oscillator 50. Thus, system 40 is capable of performing the tasks of automatic leveling control, frequency error compensation and decibel calibration. For example, automatic leveling control in system 40 is being performed by modulator 52, directional coupler 66, reference voltage means 58 and op amp 60. Compensation circuit 72 and summing amplifier 70 produce frequency error compensation. Log amplifier 68 permits calibration in decibels.

System 40 is generally configured by attaching a remote module 44 to an instrument 42. In addition, a work area generally includes several remote modules 44 and only one instrument 42. Each remote module 44 is generally adapted for a specific application. To facilitate the initial adjustment and calibration of instrument 42, each remote module 44 includes memory means 74 in which relevant data for the particular remote module 44 is stored. For example, since no two directional couplers 66 or diode detectors 76 are alike, the value of the correction voltage generated by compensation circuit 72 for a particular remote module 44 is different from the compensation value for another remote module 44. Similarly, the characteristics of log amplifier 68 in a particular remote module 44 are different from the characteristics of a different log amplifier 68 in a second remote module 44. Thus, the compensation value of the correction voltage and the characteristics of log amplifier 68 are stored in memory means 74. In addition, the upper and lower limits of the desired frequency range, e.g., 33 GHz to 50 GHz, may also be stored in memory means 74. Moreover, the desired power level and sweep speed are also stored in memory means 74. The power level data include the upper and lower limits of the amplitude of the remote module output.

When remote module 44 is attached to instrument 42, the data in memory means 74 are forwarded to instrument 42 via conventional transmission lines which are encased with coaxial cable 46, not shown. In particular, the data are forwarded to voltage reference means 58 and other devices of instrument 42. The data relating to frequency range, power level and sweep speed are forwarded to devices for setting or adjusting these values. They are existing components in any conventional instrument for generating electromagnetic energy. Since their use and operation are well within the knowledge of one skilled in the art, they will not be described in further detail.

As for the data relating to frequency error compensation and log amplifier characteristics, they are forwarded to a compensation circuit 78 and reference voltage means 58, respectively. In addition, a summing amplifier 80 is provided. These elements are provided so as to further refine the calibrated output of remote module 44. For example, the compensated voltage exiting summing amplifier 70 contains minute ripples on its amplitude such that elimination or minimization of such ripples is desired. Since no device ever generates an ideal output, the output of log amplifier 68 also contains ripples. Thus, further refinement of the output of summing amplifier 70 is desired.

In use, digital data for frequency error compensation are received by compensation circuit 78 which has an internal digital to analog converter, not shown, that converts the digital data into an analog signal. This analog signal, a frequency-varying correction voltage, is forwarded to summing amplifier 80. As for reference voltage means 58, it comprises a conventional random access memory (RAM) 82 and a conventional digital to analog (D/A) converter 83 in the preferred embodiment. In general, RAM 82 has a plurality of switches, not shown, which permit the user to manually set the desired amplitude of the reference voltage. This amplitude, which is in digital form, is then converted into analog form by D/A 83. The output of D/A 83 is forwarded to summing amplifier 80. When further refinement of the frequency error compensation or log amplifier characteristics is not desired, the manually-entered information is outputted by reference voltage means 58 as the desired reference voltage that permits op amp 60 to perform its ALC function.

In the preferred embodiment, however, the log amplifier characteristics adjustment data are received by RAM 82 which adjust the manually-selected values. These adjusted values are then converted into an analog signal by D/A 83. The signal from D/A 83, a logarithmically adjusted reference voltage, and the correction voltage from compensation circuit 78 are summed by summing amplifier 80, which outputs a compensated reference voltage. The compensated reference voltage and the compensated sampled voltage are summed by op amp 60, causing op amp 60 to generate a more refined modulating signal which enhances the refinement of the output of remote module 44.

Figure 5:
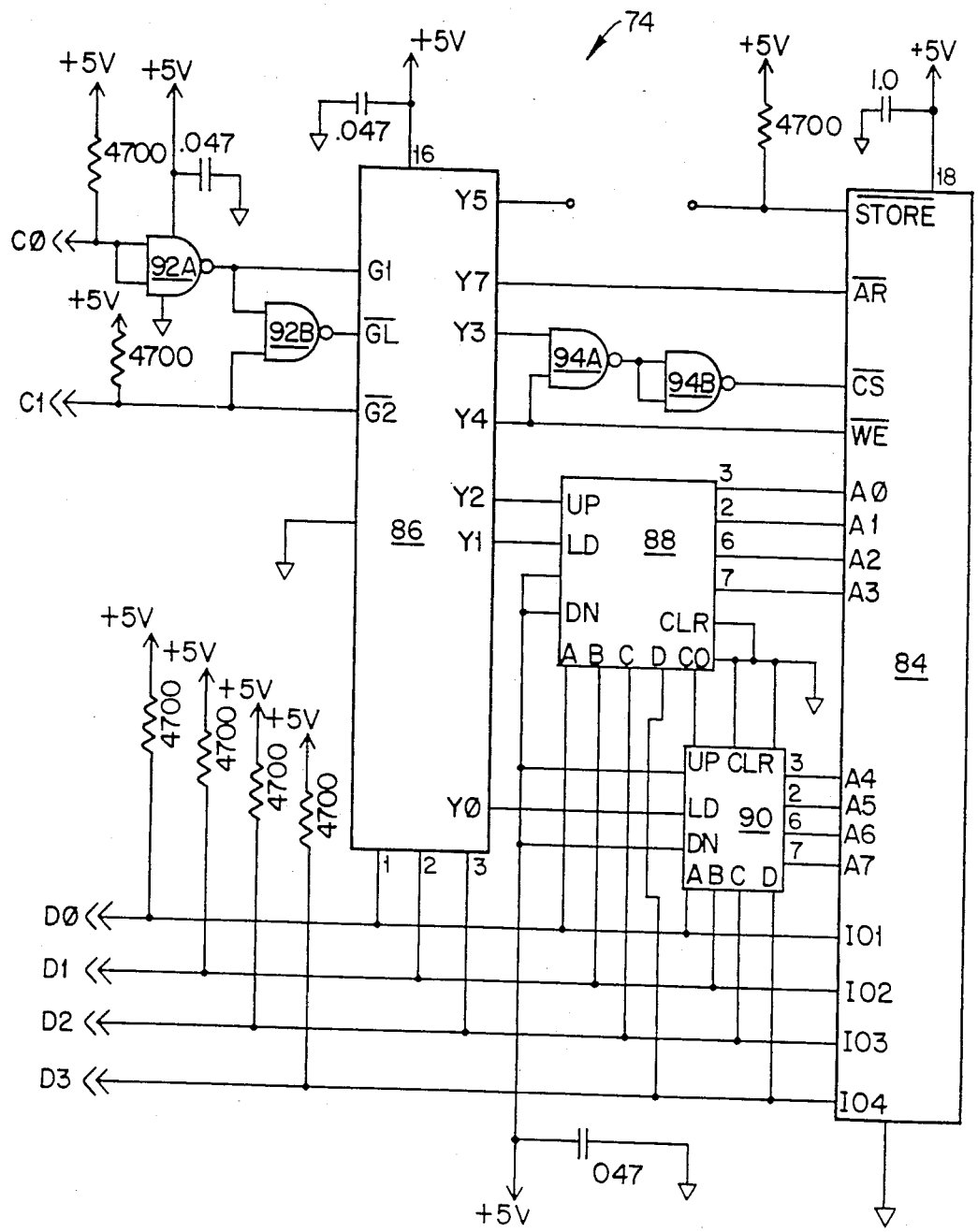
FIG. 5 is a schematic of the memory means of the remote calibrated source module of the remote calibrated power source system of FIG. 4.

As best shown in FIG. 5, memory means 74 of remote module 44 comprises a non-volatile random access memory (RAM) 84, a 3×8 decoder 86, two counters 88 and 90, a first pair of NAND gates 92A and 92B, and a second pair of NAND gates 94A and 94B. RAM 84 in the preferred embodiment is a Model 2212 non-volatile RAM manufactured by Xicor of Milpitas, Calif. The decoder 86 in the preferred embodiment is a Model 74S137 decoder manufactured by Texas Instruments Inc. of Dallas, Tex.

In use, at power on, command signals C0 and C1 activate decoder 86 such that data on bidirectional data lines D0–D3 enter decoder 86. Decoder 86 in turn outputs a signal to the −AR port of RAM 84. This signal, generally referred to as an array recall signal, causes the contents of an internal read only memory of RAM 84 to be read into an internal static random access memory in RAM 84, both not shown. RAM 84 now contains the characteristics and other values of remote module 44 and awaits access by instrument 42. To address these data, control signals C0 and C1 sequentially latch the desired addresses into counters 88 and 90.

To latch a desired address into counter 88, the address for latching the first counter is received by decoder 86 which outputs a signal at port Y1. This signal then appears at port LD of first counter 88 causing counter 88 to receive the data on data lines D0–D3. These data are in essence the four bits of an eight-bit address that must be used to access RAM 84. The four bits in counter 88 now appear at ports A0–A3 of RAM 84. To latch second counter 90, an address would appear at the three inputs of decoder 86 which in turn outputs a signal from its port Y0. This signal then appears at port LD of second counter 90, causing second counter 90 to receive the data on data lines D0–D3. These data are the four remaining bits of the address for accessing RAM 84, appearing at ports A4–A7 of RAM 84.

Control signals C0 and C1 then cause decoder 86 to receive data from data line D0–D3 such that a signal is outputted at port Y3. This signal then activates port −CS of RAM 84 such that the data located in the desired address are outputted through ports I01–I04. Control signals C0 and C1 then cause decoder 86 to receive data such that a signal is outputted at port Y2. This signal increments counters 88 and 90. The UP port of second counter 90 is connected to the CO or carryout port of counter 88. In this fashion, the relevant data for each remote module 44 are forwarded to instrument 42.

To initially store these relevant data for each remote module 44, conventional instruments, not shown, are connected between port Y5 of decoder 86 and port −STORE of RAM 84. Control lines C0 and C1 then activate decoder 86 such that decoder 86 outputs a signal at port Y4. This signal, appearing at port −WE (write enable) of RAM 84, permits the sequential inputting of the data into RAM 84.

In operation, the data for a particular remote module 44 are forwarded to instrument 42 following power on. Oscillator 50 is then activated to generate power in the millimeter wave frequency range. The power generated by instrument 42 is forwarded to remote module 44 via coaxial cable 46. Directional coupler 66 then samples the power outputted by remote module 44 so as to permit modulator 52, op amp 60 and reference voltage means 58 to perform automatic level control, thereby causing remote module 44 to output a calibrated power output. In addition, compensation circuit 72 and summing amplifier 70 perform frequency error adjustment. Moreover, the data stored in remote module memory means 74 permit instrument 42 to further refine the calibrated output of remote module 44.

Thus, instrument 42 and remote module 44, in combination, maintain the power outputted by remote module 44 at a desired calibrated level even though the power had traveled through coaxial cable 46. In addition, the waveguide need not be mounted in close proximity to instrument 42. This eliminates difficulties generally encountered by the user when he attempts to align and directly mount the waveguide to instrument 42. System 40 also eliminates difficulties relating to the mounting of other devices to the distal end of the waveguide. Moreover, system 40 is no longer a finished assembly that is both cumbersome and difficult to maneuver. Instead, the assembly that needs to be maneuvered is at the distal end of a flexible coaxial cable—remote module 44 and the various attachments. In this configuration, the user can easily position remote module 44 and the attachments at a location that is both convenient to himself and the physical layout of the work area.

It will be apparent to those skilled in the art that various modifications may be made within the spirit of the invention and the scope of the appended claims. For example, it is well within the knowledge of one skilled in the art to position the compensation circuit and the summing amplifier in either of the two input paths of the operational amplifier. In FIG. 2, compensation circuit 32 and summing amplifier 30 are positioned in the input path that includes reference voltage means 26. In FIG. 4, however, compensation circuit 72 and summing amplifier 70 are positioned in the input path that does not include reference voltage means 58.

We claim:

1. A remote calibrated power source system comprising an instrument which generates a power signal, the instrument being positioned at a first location, and a remote calibrated power source module which provides a calibrated power output signal, the remote module being positioned at a second location removed from the first location, and wherein the remote module comprises:

power sampling means which samples the power signal generated by the instrument and generates a voltage sample signal corresponding to the sampled power signal;

a logarithmic amplifier which receives the voltage sample signal and converts the voltage sample signal into decibel units of measurement;

first compensation means which generates a frequency-varying correction voltage signal;

first summing means which receives both the correction voltage signal and the converted voltage sample signal and generates a compensated voltage sample signal in response thereto; and memory means which stores data pertinent to the operation of the system, including frequency error compensation data and logarithmic adjustment data, the logarithmic adjustment data being related to the characteristics of the logarithmic amplifier, and wherein the instrument comprises:

means for generating the power signal;

second compensation means which receives frequency compensation data from the memory means and generates a frequency-varying correction voltage signal in response thereto;

a reference voltage generator which receives the logarithmic adjustment data from the memory means and generates a corresponding logarithmically adjusted reference voltage signal;

second summing means which receives the frequency-varying correction voltage signal and the logarithmically adjusted reference voltage signal and generates a compensated reference voltage signal in response thereto;

comparison means which receives the compensated reference voltage signal and the compensated voltage sample signal and generates a modulating difference voltage signal in response thereto; and modulator means which modulates the power signal in response to the modulating difference voltage signal.

2. The remote calibrated power source system of claim 1, wherein the instrument includes means for increasing the frequency of the power signal prior to sampling by the power sampling means.

3. The remote calibrated power source system of claim 2, wherein the remote module includes means for further increasing the frequency of the power signal prior to sampling by the power sampling means.

4. The remote calibrated power source system of claim 1, wherein the instrument further comprises means for generating instructional data, and wherein the memory means comprises:
- a memory device which stores the data pertinent to the operation of the system; and
- a decoder which receives the instructional data from the instrument and generates command signals in response thereto, the memory device being responsive to the command signals to output the data to the instrument.

5. The remote calibrated power source system of claim 1, wherein the reference voltage generator comprises:
- a reference memory device which receives and stores the logarithmic adjustment data in digital form; and
- a digital-to-analog converter which receives the digital logarithmic adjustment data from the reference memory device and generates the logarithmically adjusted reference voltage signal.

6. A method of providing calibrated power at a remote location, the method comprising:
- generating a power signal in an instrument positioned at a first location;
- transmitting the power signal to a remote module positioned at a second location removed from the first location;
- sampling the transmitted power signal at the remote module to generate a sampled voltage signal;
- converting the sampled voltage signal into decibel units of measurement;
- generating a frequency-varying correction voltage signal;
- summing the frequency-varying correction voltage signal and the converted sampled voltage signal to generate a compensated voltage sample signal;
- storing operational data at the remote module;
- transmitting the compensated voltage sample signal to the instrument;
- generating a reference voltage signal at the instrument in response to the operational data;
- comparing the compensated voltage sample signal and the reference voltage signal to generate a modulating difference voltage signal; and
- modulating the power signal at the instrument in response to the modulating difference voltage signal.

7. The method of claim 6, and further including the step of increasing the frequency of the power signal in the instrument prior to transmission to the remote module.

8. The method of claim 6, and further including the step of increasing the frequency of the transmitted power signal in the remote module prior to sampling the transmitted power signal.

* * * * *